US009989813B2

(12) United States Patent
Oh et al.

(10) Patent No.: US 9,989,813 B2
(45) Date of Patent: Jun. 5, 2018

(54) DISPLAY DEVICE AND METHOD OF MANUFACTURING THE SAME

(71) Applicant: SAMSUNG DISPLAY CO., LTD., Yongin-si, Gyeonggi-do (KR)

(72) Inventors: Ikhan Oh, Cheonan-si (KR); Jinho Oh, Suwon-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 270 days.

(21) Appl. No.: 14/880,987

(22) Filed: Oct. 12, 2015

(65) Prior Publication Data

US 2016/0306210 A1    Oct. 20, 2016

(30) Foreign Application Priority Data

Apr. 16, 2015    (KR) .......................... 10-2015-0053987

(51) Int. Cl.
*G02F 1/1339* (2006.01)
*G02F 1/1335* (2006.01)
*H01L 27/12* (2006.01)
*G02F 1/1333* (2006.01)
*G02F 1/1362* (2006.01)

(52) U.S. Cl.
CPC .... *G02F 1/13394* (2013.01); *G02F 1/133512* (2013.01); *H01L 27/1214* (2013.01); *G02F 1/133345* (2013.01); *G02F 2001/13396* (2013.01); *G02F 2001/136222* (2013.01)

(58) Field of Classification Search
CPC ................... G02F 1/13394; G02F 2001/13396
See application file for complete search history.

(56) References Cited

U.S. PATENT DOCUMENTS

| 2009/0147208 | A1  | 6/2009 | Tatemori et al. | |
|---|---|---|---|---|
| 2012/0038867 | A1* | 2/2012 | Kwon | G02F 1/133512 349/110 |
| 2014/0299264 | A1  | 10/2014 | Umeda et al. | |
| 2015/0103296 | A1* | 4/2015 | Kwak | G02F 1/134309 349/106 |
| 2016/0062170 | A1* | 3/2016 | Yin | G02F 1/13394 349/106 |

FOREIGN PATENT DOCUMENTS

| KR | 10-2007-0105457 | 10/2007 |
|---|---|---|
| KR | 10-2009-0060159 | 6/2009 |
| KR | 10-2012-0014749 | 2/2012 |

* cited by examiner

*Primary Examiner* — Phu Vu
(74) *Attorney, Agent, or Firm* — Innovation Counsel, LLP

(57) ABSTRACT

A display device includes: a first substrate; a wiring unit on the first substrate and including a thin film transistor; a protection layer on the wiring unit and having at least a concave portion; and a light shielding unit on the protection layer, wherein the light shielding unit includes: a light shielding layer; a first column spacer protruding from the light shielding layer; and a second column spacer on the concave portion and protruding from the light shielding layer to be spaced apart from the first column spacer.

17 Claims, 8 Drawing Sheets

DISPLAY DEVICE AND METHOD OF MANUFACTURING THE SAME

CROSS-REFERENCE TO RELATED APPLICATION

This application claims the priority to and all the benefits accruing under 35 U.S.C. § 119 of Korean Patent Application No. 10-2015-0053987, filed on Apr. 16, 2015, with the Korean Intellectual Property Office (KIPO), the disclosure of which is incorporated herein in its entirety by reference.

BACKGROUND

1. Field

Embodiments of the present inventive concept relate to a display device and a method of manufacturing the same, and more particularly, to a display device in which a light shielding layer and a column spacer are integrally formed and a method of manufacturing the same.

2. Description of the Related Art

Display devices are classified into a liquid crystal display ("LCD") devices, an organic light emitting diode ("OLED") display devices, a plasma display panel ("PDP") devices, an electrophoretic display ("EPD") devices, and the like, based on a light emitting scheme thereof.

An LCD device includes two substrates opposing one another, an electrode on at least one of the two substrates, and a liquid crystal layer interposed between the two substrates.

Generally, in such an LCD device, one of the two substrates includes a plurality of thin film transistors and a pixel electrode formed thereon, and the other thereof includes a plurality of color filters, a light shielding layer, and a common electrode formed thereon.

In recent times, a color filter on array ("COA") structure in which a color filter, a light shielding layer, a pixel electrode, and the like, are formed on a single substrate has been suggested.

Meanwhile, in order to maintain a uniform cell gap, which is a distance between two substrates, a plurality of column spacers need to be formed on at least one of the two substrates. In addition, for a relatively simplified manufacturing process of a display device, a black column spacer ("BCS") structure in which a light shielding layer and a column spacer are simultaneously formed has been suggested.

A pattern mask is used to form such a black column spacer structure, and an exposure mask having a plurality of different tones may be used to simultaneously form a light shielding layer and a column spacer in a single process. As the number of tones of the exposure mask increases, a likelihood of errors that may occur during the manufacturing process thereof may also increase.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

Aspects of embodiments of the present inventive concept are directed to a method of collectively forming a first column spacer, a second column spacer, and a light shielding layer, using an exposure mask having three or less tones.

Aspects of embodiments of the present inventive concept are also directed to a display device having a structure in which a first column spacer, a second column spacer, and a light shielding layer are collectively formed, using an exposure mask having three or less tones.

According to an exemplary embodiment of the present inventive concept, a display device includes: a first substrate; a wiring unit on the first substrate and including a thin film transistor; a protection layer on the wiring unit and having at least a concave portion; and a light shielding unit on the protection layer, wherein the light shielding unit includes: a light shielding layer; a first column spacer protruding from the light shielding layer; and a second column spacer on the concave portion and protruding from the light shielding layer to be spaced apart from the first column spacer.

The first column spacer may have a height greater than a height of the second column spacer measure from an upper surface of the light shielding layer.

The first column spacer may have a substantially same thickness as a thickness of the second column spacer measure from a bottom surface of the light shielding layer.

The light shielding layer, the first column spacer, and the second column spacer may be formed of a same material.

The protection layer may include a photosensitive organic material.

The display device may further include a color filter layer interposed between the first substrate and the protection layer.

The display device may further include a first electrode on the protection layer.

The display device may further include a second substrate disposed on the light shielding unit to oppose the first substrate.

The first column spacer may support the second substrate.

The display device may further include a liquid crystal layer interposed between the first substrate and the second substrate.

According to another exemplary embodiment of the present inventive concept, a method of manufacturing a display device, the method includes: forming a wiring unit including a thin film transistor, on a first substrate; forming a protection layer having a concave portion, on the wiring unit; and forming a light shielding unit including a light shielding layer, a first column spacer and a second column spacer, on the protection layer, wherein the second column spacer is formed on the concave portion of the protection layer.

The first column spacer may have a height greater than a height of the second column spacer measure from an upper surface of the light shielding layer.

The first column spacer may have a substantially same thickness as a thickness of the second column spacer measure from a bottom surface of the light shielding layer.

The forming of the protection layer may include: coating a first photosensitive composition for forming a protection layer, on the wiring unit; exposing the first photosensitve composition by disposing a first exposure mask on the first photosensitve composition and irradiating light on to the first photosensitive composition; and developing the exposed first photosensitive composition and curing, wherein the first exposure mask includes a transmissive portion, a semi-transmissive portion, and a light shielding portion.

The semi-transmissive portion of the first exposure mask may correspond to an area for the concave portion to be formed.

The forming of the light shielding unit may include: coating a second photosensitive composition for forming a light shielding unit, on the protection layer; exposing the second photosensitve composition by disposing a second exposure mask on the second photosensitve composition and irradiating light on to the second photosensitive composition; and developing the exposed second photosensitive composition and curing, wherein the second exposure mask includes a transmissive portion, a semi-transmissive portion, and a light shielding portion.

The transmissive portion of the second exposure mask may correspond to an area for the first column spacer to be formed and an area for the second column spacer to be formed.

The method may further include forming a color filter layer on the first substrate, prior to the forming of the protection layer.

The method may further include forming a first electrode on the protection layer, subsequent to the forming of the protection layer and prior to the forming of the light shielding unit.

The method may further include disposing a second substrate on the light shielding unit to oppose the first substrate, subsequent to the forming of the light shielding unit.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of the present disclosure of inventive concept will be more clearly understood from the following detailed description taken in conjunction with the accompanying drawings, in which.

DETAILED DESCRIPTION

Figure 1:
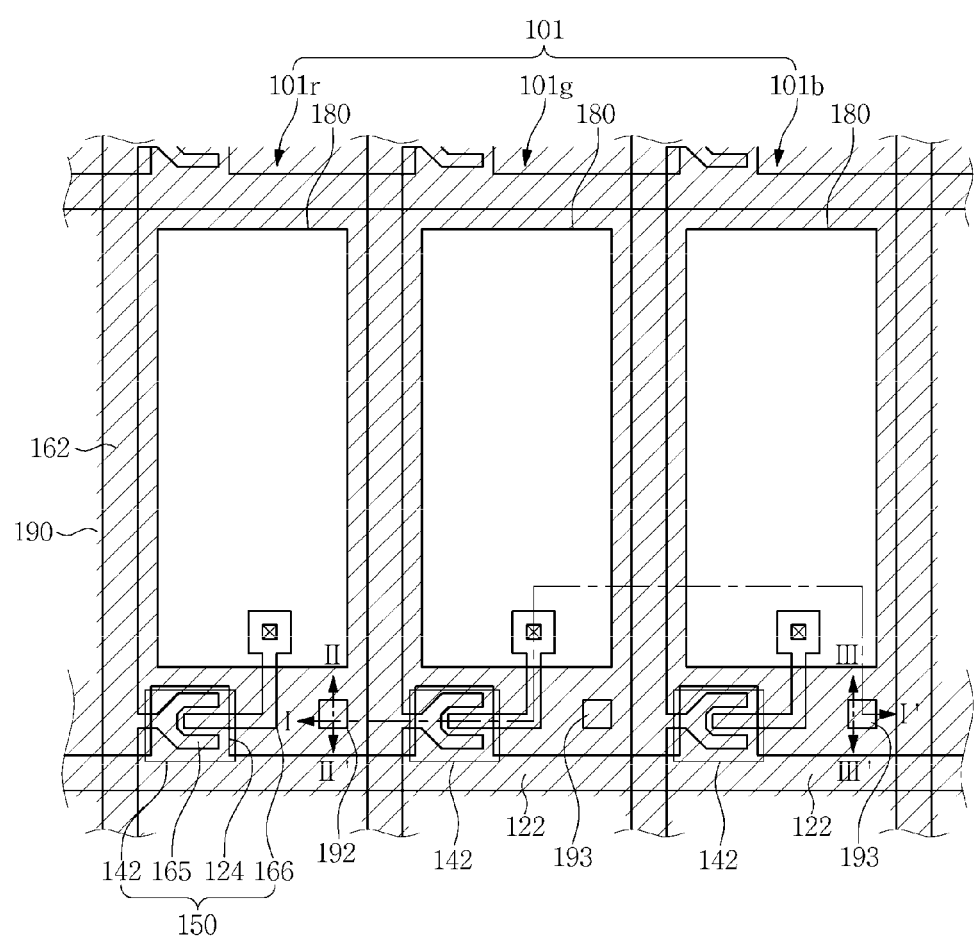
FIG. 1 is a plan view illustrating a display device according to a first exemplary embodiment.

Exemplary embodiments will now be described more fully hereinafter with reference to the accompanying drawings.

However, they may be embodied in different forms and should not be construed as limited to the exemplary embodiments set forth herein. Rather, these exemplary embodiments are provided so that this disclosure will be thorough and complete, and will fully convey exemplary implementations to those skilled in the art.

In the drawings, the dimensions of certain elements or shapes may be simplified or exaggerated to better illustrate the present inventive concept, and other elements present in an actual product may also be omitted. Thus, the drawings are intended to facilitate the understanding of the present inventive concept. Like reference numerals refer to like elements throughout the specification.

When a layer or element is referred to as being "on" another layer or element, the layer or element may be directly on the other layer or element, or one or more intervening layers or elements may be interposed therebetween.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

When it is determined that a detailed description may make the purpose of the present inventive concept unnecessarily ambiguous in the description of the present inventive concept, such a detailed description will be omitted. In addition, the same components and corresponding components are given the same reference numeral.

Hereinafter, a first exemplary embodiment with respect to a display device will be described with reference to FIGS. 1 through 3.

Figure 2:
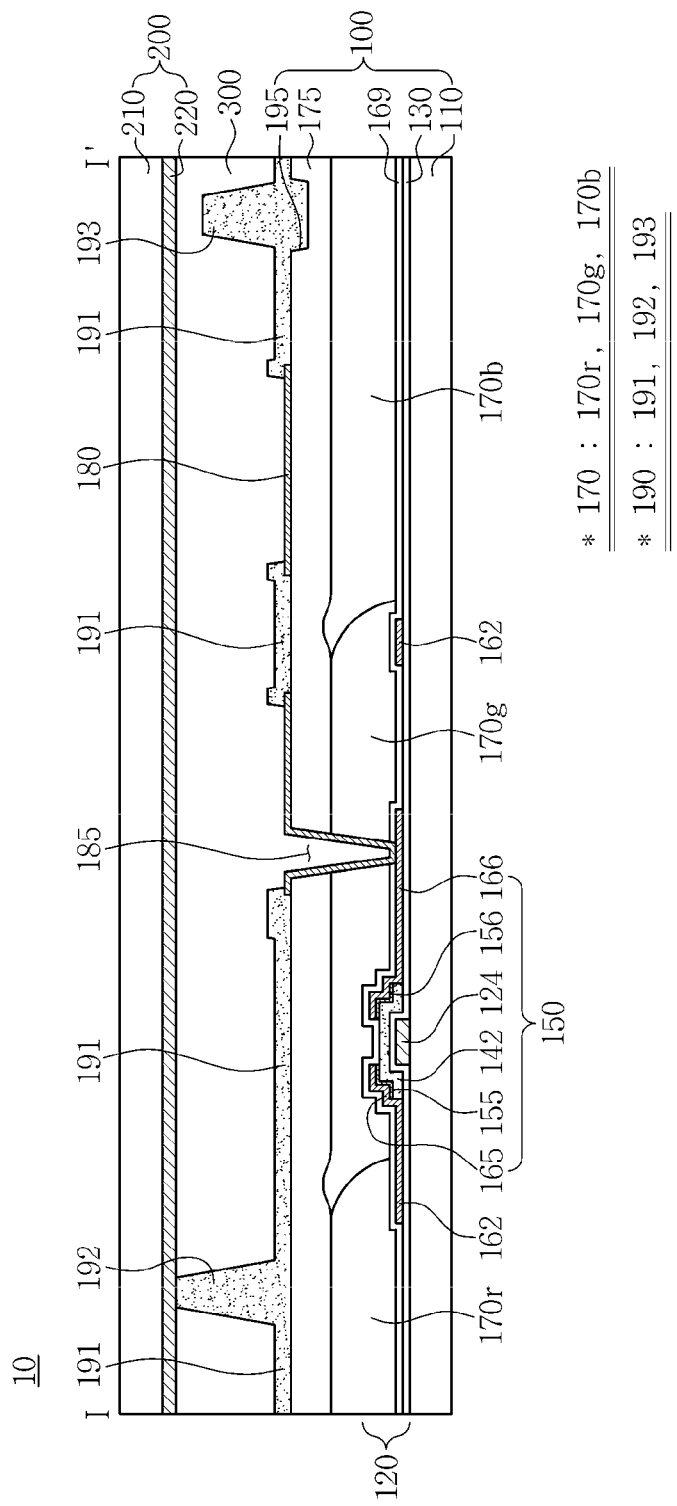
FIG. 2 is a cross-sectional view taken along line I-I' of FIG. 1.

FIG. 1 is a plan view illustrating the display device according to the first exemplary embodiment; and FIG. 2 is a cross-sectional view taken along line I-I' of FIG. 1.

The display device according to the first exemplary embodiment may be a liquid crystal display ("LCD") device 10. The LCD device 10 may include a first substrate 110, a second substrate 210 disposed to oppose the first substrate 110, and a liquid crystal layer 300 interposed between the first substrate 110 and the second substrate 210.

However, the scope of the present inventive concept is not limited to such an LCD device, and the display device according to the first exemplary embodiment may also use an organic light emitting diode ("OLED") display device.

Referring to FIGS. 1 and 2, the LCD device 10 may include a lower panel 100, an upper panel 200 disposed to oppose the lower panel 100, and the liquid crystal layer 300 interposed between the lower panel 100 and the upper panel 200.

The lower panel 100 may include the first substrate 110, a wiring unit 120 on the first substrate 110 and including a thin film transistor 150, a color filter layer 170 on the wiring unit 120, a protection layer 175 on the color filter layer 170, and a first electrode 180 and a light shielding unit 190 which are disposed on the protection layer 175.

The first substrate 110 may be an insulating substrate formed of transparent glass such as soda-lime glass or borosilicate glass, plastic, or the like.

Gate wirings 122 and 124 that transmit a gate signal may be disposed on the first substrate 110. The gate wirings 122 and 124 may include a gate line 122 extending in a direction, for example, a transverse direction, and a gate electrode 124 protruding from the gate line 122 to have a protrusion shape. The gate electrode 124, along with a source electrode 165, a drain electrode 166 and a semiconductor layer 142 which are to be described below, may constitute the thin film transistor 150.

Although not illustrated, the first electrode 180 and a storage wiring (not illustrated) for forming a storage capacitor may further be disposed on the first substrate 110. The storage wiring (not illustrated) may be formed of the same material as a material forming the gate wirings 122 and 124, and may be disposed on the same layer as a layer on which the gate wirings 122 and 124 are disposed.

The gate wirings 122 and 124 may include one of the following metals: an aluminum (Al)-based metal such as Al or an Al alloy, a silver (Ag)-based metal such as Ag or an Ag alloy, a copper (Cu)-based metal such as Cu or a Cu alloy, a molybdenum (Mo)-based metal such as Mo or a Mo alloy, chromium (Cr), tantalum (Ta), and titanium (Ti).

The gate wirings 122 and 124 may have a multilayer structure including two conductive layers having different physical properties from one another.

One of the two conductive layers may include a metal having relatively low resistivity so as to reduce a signal delay or a voltage drop of the gate wirings 122 and 124, for example, an Al-based metal, an Ag-based metal or a Cu-based metal.

In addition, the other of the two conductive layers may include a material, for example, a Mo-based metal, Cr, Ti or Ta, which has an excellent contact characteristic with a transparent conductive oxide (TCO) such as indium-tin oxide (ITO), indium-zinc oxide (IZO) or aluminum-zinc oxide (AZO).

Examples of the gate wirings 122 and 124 having such a multilayer structure may include a wiring having a Cr lower layer and an Al upper layer, a wiring having an Al lower layer and a Mo upper layer, and a wiring having a Ti lower layer and a Cu upper layer. However, the material forming the gate wirings 122 and 124 is not limited thereto, and the gate wirings 122 and 124 may include various types of metals and conductive materials.

A gate insulating layer 130 may be disposed on the first substrate 110 and the gate wirings 122 and 124. The gate insulating layer 130 may include silicon oxide ($SiO_x$) or silicon nitride ($SiN_x$). In addition, the gate insulating layer 130 may further include aluminum oxide, titanium oxide, tantalum oxide, or zirconium oxide.

The semiconductor layer 142, which is provided to form a channel of the thin film transistor 150, may be disposed on the gate insulating layer 130. At least a portion of the semiconductor layer 142 may overlap the gate electrode 124. The semiconductor layer 142 may include amorphous silicon (hereinafter, referred to as "a-Si"), or an oxide semiconductor including at least one of gallium (Ga), indium (In), tin (Sn), and zinc (Zn).

Ohmic contact layers 155 and 156 may be disposed on the semiconductor layer 142. The ohmic contact layers 155 and 156 may serve to enhance a contact characteristic between the source electrode 165 and/or the drain electrode 166, which are to be described below, and the semiconductor layer 142.

For example, the ohmic contact layers 155 and 156 may include amorphous silicon doped with n-type impurities at high concentration (hereinafter, referred to as "n+a-Si"). In a case in which the contact characteristic between the source electrode 165 and/or the drain electrode 166 and the semiconductor layer 142 is sufficiently secured, the ohmic contact layers 155 and 156 may be omitted.

Data wirings 162, 165, and 166 may be disposed on the ohmic contact layers 155 and 156 and the gate insulating layer 130. The data wirings 162, 165, and 166 may include a data line 162 disposed in a longitudinal direction, for example, a direction intersecting the gate line 122, the source electrode 165 branching off from the data line 162 to extend onto an upper portion of the semiconductor layer 142, and the drain electrode 166 spaced apart from the source electrode 165 and disposed on an upper portion of the semiconductor layer 142 to oppose the source electrode 165 while having a channel region of the thin film transistor 150 in the middle therebetween. In this instance, the drain electrode 166 may extend from the upper portion of the semiconductor layer 142 on to a lower portion of the first electrode 180.

A pixel region 101 including a red pixel region 101r, a green pixel region 101g, and a blue pixel region 101b may be defined by the data line 162 and the gate line 122; however, the definition of the pixel region 101 is not limited thereto. The pixel region 101 including the pixel regions 101r, 101g, and 101b may be defined by a light shielding layer 191. A description pertaining to the light shielding layer 191 will be provided further below.

An insulating interlayer 169 may be disposed on the data wirings 162, 165, and 166, an exposed portion of the semiconductor layer 142, and an exposed portion of the gate insulating layer 130. The insulating interlayer 169 may have a monolayer or multilayer structure including $SiO_x$, $SiN_x$, an organic material having photosensitivity, a low-dielectric-constant insulating material such as a-Si:C:O or a-Si:O:F, or the like.

The structure of the thin film transistor 150 described hereinabove with reference to FIGS. 1 and 2 is only given by way of example; accordingly, the structure of the thin film transistor 150 is not limited thereto. Further, the wiring unit 120 may be modified to have various shapes.

The color filter layer 170 including a red color filter 170r, a green color filter 170g, and a blue color filter 170b may be disposed on the wiring unit 120.

The red color filter 170r, the green color filter 170g, and the blue color filter 170b may be disposed to correspond to the red pixel region 101r, the green pixel region 101g and the blue pixel region 101b, respectively. For example, the red color filter 170r, the green color filter 170g, and the blue color filter 170b may be disposed to each have an island shape while corresponding to the red pixel region 101r, the green pixel region 101g, and the blue pixel region 101b, respectively.

The red color filter 170r, the green color filter 170g, and the blue color filter 170b may be disposed to be spaced apart from one another in a transverse or longitudinal direction, or may be disposed to have respective edge portions of adjacent color filters to overlap one another.

The color filter layer 170 may further include a color filter representing another color, other than the colors of the red color filter 170r, the green color filter 170g, and the blue color filter 170b. For example, the color filter layer 170 may include a white color filter region (not illustrated) which does not have a color filter.

The color filter layer 170 may have a thickness in a range of about 2 micrometers (μm) to about 4 μm. However, the thickness of the color filter layer 170 is not limited thereto.

The protection layer 175 may be disposed on the color filter layer 170.

The protection layer 175 may have at least a concave portion 195. The concave portion 195 may cause a step difference in column spacers 192 and 193. A description pertaining to the column spacers 192 and 193 will be provided further below. In addition, the protection layer 175 may have a thickness in a range of about 1.0 μm to about 2.5 μm.

The protection layer 175 may have a monolayer or multilayer structure including $SiO_x$, $SiN_x$, an organic material having photosensitivity, a low-dielectric-constant insulating material such as a-Si:C:O or a-Si:O:F, or the like.

According to the first exemplary embodiment, the protection layer 175 may be formed of a first photosensitive composition 171 (refer to FIG. 5C) which is a positive-type photosensitive composition in which an exposed portion thereof is developed. For example, the protection layer 175 may include a photosensitive organic material. In the case that the protection layer 175 includes a photosensitive organic material, the protection layer 175 may be also referred to as an organic layer.

Further, the protection layer 175 may serve to planarize an upper portion of the wiring unit 120 and the color filter layer 170. Accordingly, the protection layer 175 may be also referred to as a planarization layer.

Portions of the insulating interlayer 169, the color filter layer 170, and the protection layer 175 may be removed, whereby a contact hole 185 is formed through which a portion of the drain electrode 166 disposed below the first electrode 180 is exposed.

The first electrode 180 which is electrically connected to the drain electrode 166 through the contact hole 185 may be disposed on the protection layer 175. The first electrode 180 may include a transparent conductive oxide (TCO) such as indium-tin oxide (ITO), indium-zinc oxide (IZO) or aluminum-zinc oxide (AZO). According to the first exemplary embodiment, the first electrode 180 may be a pixel electrode and may be disposed in the pixel region 101.

Since the contact hole 185 and the concave portion 195 are formed in the protection layer 175 as described above, the protection layer 175 may have three step differences. The protection layer 175 may be formed using a three-tone mask which includes three areas having different levels of light transmittance from one another. A description pertaining to a process of forming the protection layer 175 will be provided further below.

The light shielding unit 190 may be disposed on the protection layer 175. The light shielding unit 190 may be disposed on a portion of the protection layer 175 other than a portion of the protection layer 175 including the first electrode 180 formed thereon, and may overlap a portion of an edge of the first electrode 180. However, the first exemplary embodiment is not limited thereto, and the light shielding unit 190 and the first electrode 180, which is disposed in the pixel region 101, may not overlap each other.

The light shielding unit 190 may block light supplied from a backlight unit (not illustrated), and may prevent externally supplied light from being irradiated onto the gate line 122, the data line 162, or the thin film transistor 150.

The light shielding unit 190 may include the light shielding layer 191 and the column spacers 192 and 193 which protrude from the light shielding layer 191.

The light shielding layer 191 may overlap the gate line 122, the data line 162, and the thin film transistor 150. For example, the light shielding layer 191 may have a lattice structure in which the light shielding layers 191 are arranged along the gate line 122 and the data line 162.

The light shielding layer 191, also referred to as a black matrix, may distinguish plurality of color filters, for example, the red, green and blue color filters 170r, 170g and 170b from one another, may define the pixel region 101, and may prevent light leakage.

The column spacers 192 and 193 may have a structure protruding from the light shielding layer 191. In other words, portions of the light shielding layer 191 having such protruding structures may correspond to the column spacers 192 and 193, respectively. The column spacers 192 and 193 may include a first column spacer 192 and a second column spacer 193 which have a step difference therebetween and are spaced apart from one another. Bottom surfaces 192b and 193b (refer to FIG. 3) of the first and second column spacers 192 and 193 may correspond to portions of the light shielding layer 191, respectively.

The first column spacer 192 may maintain a predetermined distance between the lower panel 100 and the upper panel 200, thereby enhancing the overall operational efficiency of the LCD device 10.

In detail, the distance between the lower panel 100 and the upper panel 200 may refer to as a cell gap, and such a cell gap may affect the overall operational efficiency of the LCD device 10 in terms of, for example, response speed, a contrast ratio, a viewing angle, or a luminance uniformity. Accordingly, with a non-uniform cell gap, an image may not be uniformly displayed over an entire screen of the LCD device 10, resulting in a degraded picture quality. In this regard, in order to maintain a uniform cell gap throughout an entire area between the lower and upper panels 100 and 200, a plurality of column spacers, for example, the first and second column spacers 192 and 193, may need to be disposed on at least one of the lower panel 100 and the upper panel 200.

In the first and second column spacers 192 and 193 according to the first exemplary embodiment, the first column spacer 192 may maintain the cell gap between the lower panel 100 and the upper panel 200, and the second column spacer 193 may assist the first column spacer 192. In other words, the first column spacer 192 may support the lower panel 100 and the upper panel 200, thereby securing the distance therebetween. The first column spacer 192 may be also referred to as a main column spacer, and the second column spacer 193 may be also referred to as a sub-column spacer. Locations of the first column spacer 192 and the second column spacer 193 are not limited to those described in FIG. 1. Alternatively, the first column spacer 192 may be located over the thin film transistor 150 of the blue pixel region 101b, and the second column spacer 193 may be located over the drain electrode 166 of the thin film transistor 150 of the red pixel region 101r.

According to the first exemplary embodiment, the light shielding layer 191 and the first and second column spacers 192 and 193 may be collectively formed of the same material. In other words, the light shielding unit 190 according to the first exemplary embodiment may have a black column spacer ("BCS") structure in which the light shielding layer 191 and the first and second column spacers 192 and 193 are simultaneously formed.

The light shielding unit 190 may be formed of a second photosensitive composition 199 (refer to FIG. 5G) which is a negative-type photosensitive composition in which a non-exposure portion thereof is developed. For example, the second photosensitive composition 199 used to form the light shielding unit 190 may include a binder resin, a polymerizable monomer, a polymerizable oligomer, a pigment, a dispersant, and/or a photo-initiator. Examples of the pigment may include a black pigment, a black resin, or the like.

Although not illustrated, a lower alignment layer may be disposed on the first electrode 180 and the light shielding unit 190. The lower alignment layer may be a homeotropic alignment layer, and may include a photo-reactive material. For example, the lower alignment layer may include at least one of the following materials: polyamic acid, polysiloxane, and polyimide.

The LCD device 10 according to the first exemplary embodiment may have a color filter on array ("COA") structure in which the thin film transistor 150 and the color filter layer 170 are disposed on the same substrate, and may have the black column spacer ("BCS") structure in which the light shielding layer 191 and the first and second column spacers 192 and 193 are integrally formed.

The upper panel 200 may include the second substrate 210 and a second electrode 220. The second substrate 210 may be an insulating substrate formed of a transparent material such as glass or plastic. The second electrode 220 may include a transparent conductive oxide (TCO) such as indium-tin oxide (ITO), indium-zinc oxide (IZO) or aluminum-zinc oxide (AZO).

According to the first exemplary embodiment, the second electrode 220 may be a common electrode.

Although not illustrated, the upper panel 200 may further include an upper alignment layer. The upper alignment layer may be disposed on the second electrode 220. The upper alignment layer may be formed of the same material as that forming the lower alignment layer.

When surfaces of the first substrate 110 and the second substrate 220 that oppose one another are defined as upper surfaces of the corresponding substrates, and surfaces of the first substrate 110 and the second substrate 220 that are opposite to the upper surfaces thereof are defined as lower surfaces of the corresponding substrates, polarizers may be disposed on the lower surface of the first substrate 110 and the lower surface of the second substrate 210, respectively.

The liquid crystal layer 300 may be interposed between the lower panel 100 and the upper panel 200, the distance therebetween being secured by the first and second column spacers 192 and 193.

The liquid crystal layer 300 may include a liquid crystal molecule. Within the liquid crystal layer 300, the liquid crystal molecule may have a structure in which a major axis of the liquid crystal molecule is parallel to one of the upper panel 200 and the lower panel 100 and a direction of the major axis is twisted into a spiral shape at an angle of 90 degrees from a rubbing direction of the alignment layer of the lower panel 100 to the upper panel 200. Alternatively, the liquid crystal layer 300 may include homeotropic liquid crystal molecules.

Hereinafter, a description pertaining to the structure of the protection layer 175, the first column spacer 192, and the second column spacer 193 will be provided in further detail with reference to FIG. 3.

Figure 3:
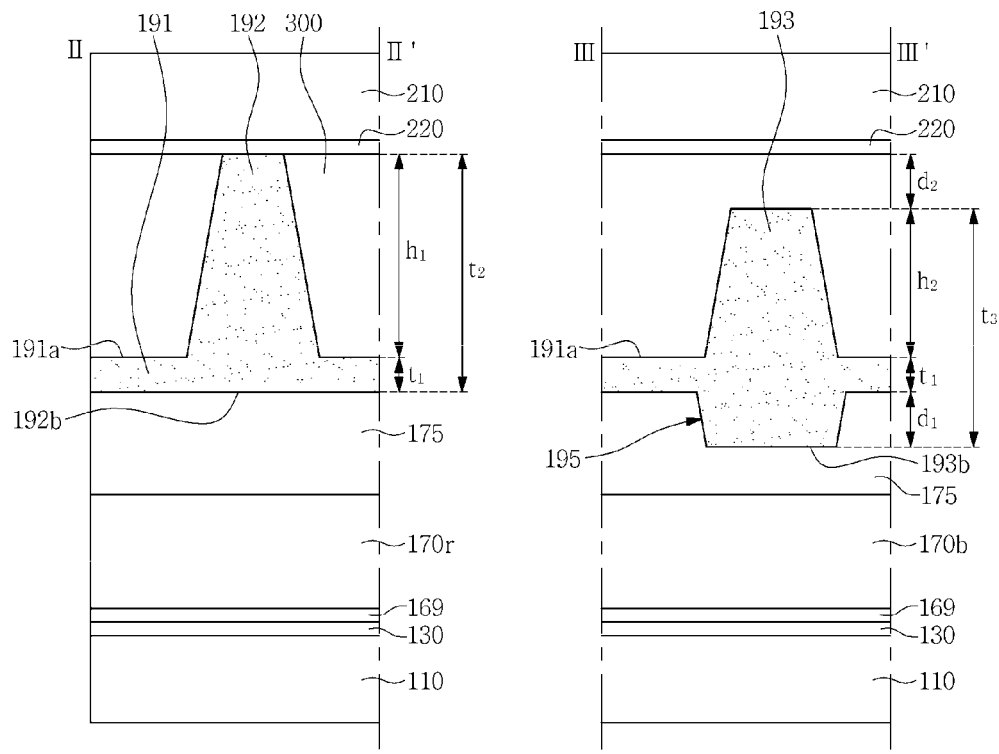
FIG. 3 illustrates cross-sectional views taken along lines II-II' and III-III' of FIG. 1, respectively.

FIG. 3 illustrates cross-sectional views taken along lines II-II' and III-III' of FIG. 1, respectively. In detail, one of the cross-sectional views on the left-side of FIG. 3 is taken along line II-II'; and the other of the cross-sectional views on the right-side of FIG. 3 is taken along line III-III'.

As illustrated in the right-side of FIG. 3, the protection layer 175 may have the concave portion 195, and the second column spacer 193 may be disposed on the concave portion 195 of the protection layer 175. In this regard, although a thickness $t_2$ of the first column spacer 192 and a thickness $t_3$ of the second column spacer 193 are the same as one another ($t_2=t_3$), the first column spacer 192 and the second column spacer 193 may have a step difference therebetween.

In detail, a height $h_1$ of the first column spacer 192 is greater than a height $h_2$ of the second column spacer 193 measure from an upper surface 191a of the light shielding layer 191. Accordingly, the first column spacer 192 may contact with the upper panel 200 so as to maintain the cell gap between the lower panel 100 and the upper panel 200, and the second column spacer 193 may be spaced apart from the upper panel 200 by a distance of $d_2$.

The distance $d_2$ between the second column spacer 193 and the upper panel 200 may be substantially the same as a depth $d_1$ of the concave portion 195. Alternatively, magnitudes of the depth $d_1$ and the distance $d_2$ may be different from each other. For example, the depth $d_1$ may be in a range from about 0.3 μm to about 1.0 μm and the distance $d_2$ may be in a range from about 0.1 μm to about 0.8 μm.

In addition, the first column spacer 192 and the second column spacer 193 may have the same thickness measure from the bottom surfaces 192b and 193c of the light shielding layer 191. In other words, the thickness $t_2$ of the first column spacer 192 may be the same as the thickness $t_3$ of the second column spacer 193. ($t_2=t_3$).

Hereinafter, a second exemplary embodiment with respect to a display device will be described with reference to FIG. 4. A detailed description pertaining to the configuration of the display device according to the second exemplary embodiment the same as that of the first exemplary embodiment will be omitted herein for conciseness.

Figure 4:
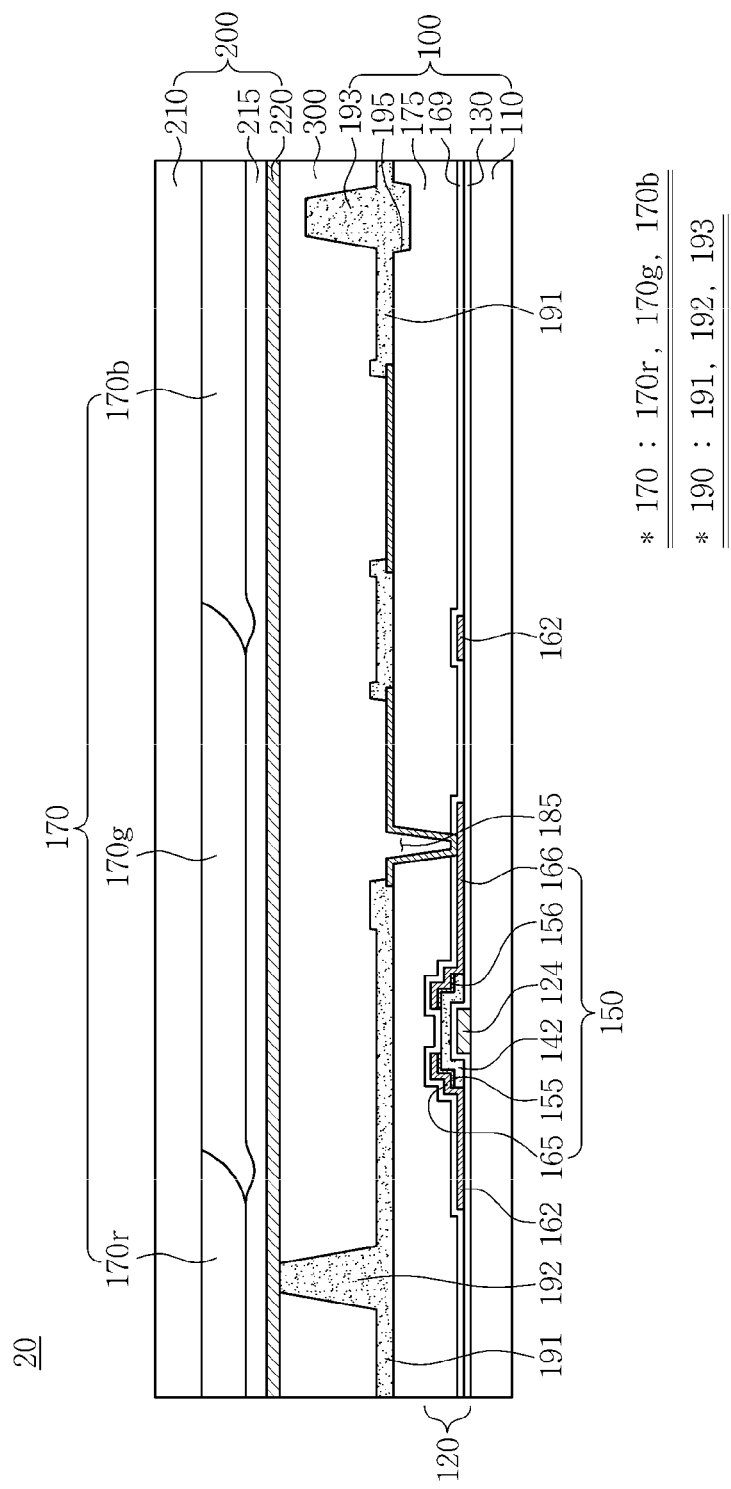
FIG. 4 is a cross-sectional view illustrating a display device according to a second exemplary embodiment.

FIG. 4 is a cross-sectional view illustrating the display device according to the second exemplary embodiment. The display device according to the second exemplary embodiment may be an LCD device 20. In the LCD device 20 according to the second exemplary embodiment, an upper panel 200 may include a color filter layer 170.

In detail, the LCD device 20 according to the second exemplary embodiment may include a lower panel 100, the upper panel 200, and a liquid crystal layer 300.

The lower panel 100 may include a first substrate 110, a wiring unit 120 on the first substrate 110, a protection layer 175 on the wiring unit 120, and a first electrode 180 and a light shielding unit 190 on the protection layer 175.

The upper panel 200 may include a second substrate 210, a color filter layer 170, an overcoat layer 215, and a second electrode 220.

The second substrate 211 may be formed of a transparent material such as glass or plastic.

The color filter layer 170 may be disposed to correspond to a pixel region 101. The color filter layer 170 may include a red color filter 170r, a green color filter 170g, and a blue color filter 170b.

The overcoat layer 215 may be disposed on the color filter layer 170. The overcoat layer 215 may planarize an upper portion of the color filter layer 170, and may protect the color filter layer 170. The overcoat layer 215 may be formed of, for example, an acrylic epoxy material.

The second electrode 220 may be disposed on the overcoat layer 215. The second electrode 220 may be a common electrode.

The liquid crystal layer 300 may be interposed between the lower panel 100 and the upper panel 200.

Hereinafter, a method of manufacturing the LCD device 10 according to the first exemplary embodiment will be described with reference to FIGS. 5A through 5I. FIGS. 5A through 5I are cross-sectional views illustrating sequential processes of the method of manufacturing the LCD device 10 according to the first exemplary embodiment, respectively.

Figure 5A:
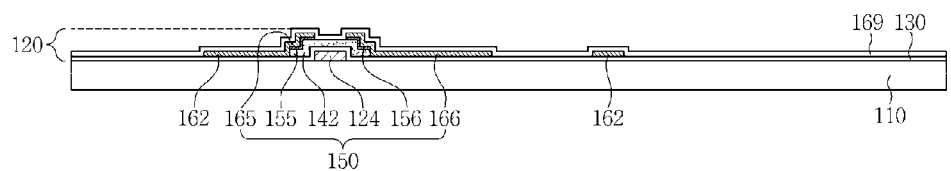
FIGS. 5A, 5B, 5C, 5D, 5E, 5F, 5G, 5H and 5I are cross-sectional views illustrating a method of manufacturing the display device according to the first exemplary embodiment, respectively.

Referring to FIG. 5A, the wiring unit 120 is formed on the first substrate 110 formed of a transparent material such as glass or plastic. The wiring unit 120 includes the thin film transistor 150.

In detail, the gate wirings 122 (refer to FIG. 1) and 124 are formed on the first substrate 110. The gate wirings 122 and 124 include the gate line 122 and the gate electrode 124.

The gate insulating layer 130, formed of $SiN_x$ or $SiO_x$, is formed on the gate wirings 122 and 124.

The semiconductor layer 142, overlapping at least a portion of the gate electrode 124, is formed on the gate insulating layer 130.

The ohmic contact layers 155 and 156 are formed on the semiconductor layer 142.

The data wirings 162, 165, and 166 are formed on the ohmic contact layers 155 and 156 and the gate insulating layer 130. The data wirings 162, 165, and 166 include the data line 162, the source electrode 165, and the drain electrode 166. The data line 162 intersects the gate line 122. The source electrode 165 branches off from the data line 162 to extend onto the upper portion of the semiconductor layer 142. The drain electrode 166 is disposed on the upper portion of the semiconductor layer 142 to be spaced apart from the source electrode 165.

The gate electrode 124, the semiconductor layer 142, the source electrode 165, and the drain electrode 166 constitute the thin film transistor 150.

Figure 5B:
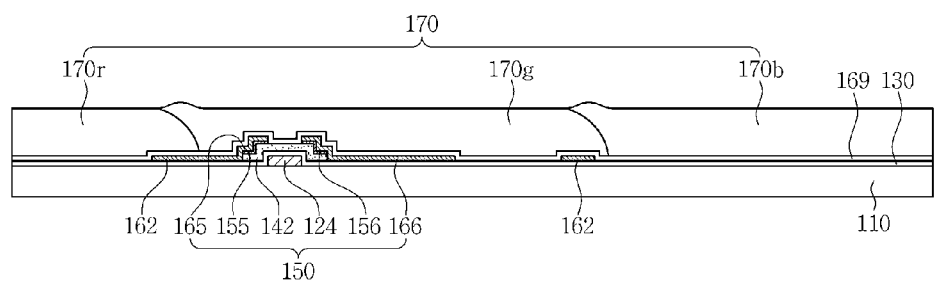

Referring to FIG. 5B, the color filter layer 170 is formed on the wiring unit 120.

The color filter layer 170 includes the red color filter 170r, the green color filter 170g, and the blue color filter 170b. Respective edges of adjacent color filters, among the red, green and blue color filters 170r, 170g and 170b, overlap one another. However, the edges of adjacent color filters, among the red, green and blue color filters 170r, 170g and 170b, may not overlap one another.

Figure 5C:
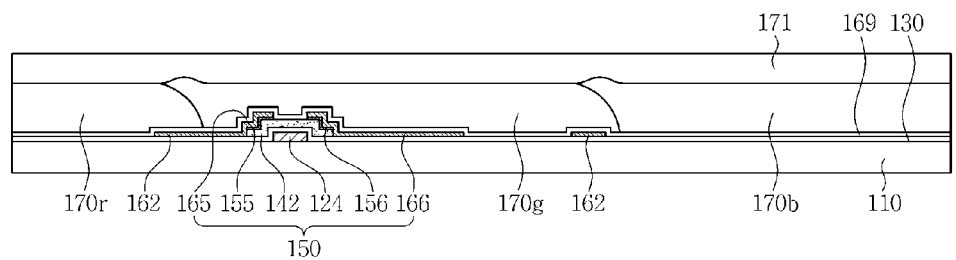

Referring to FIG. 5C, the first photosensitive composition 171 for forming the protection layer 175 is coated on the color filter layer 170. The first photosensitive composition 171 may have a planarized surface.

The first photosensitive composition 171 includes a positive-type photosensitive resin composition in which solubility with respect to a developing solution increases by light irradiation.

The first photosensitive composition 171 may include, for example, a binder resin, a polymerizable monomer, a polymerizable oligomer, a dispersant, and/or a photo-initiator.

Figure 5D:
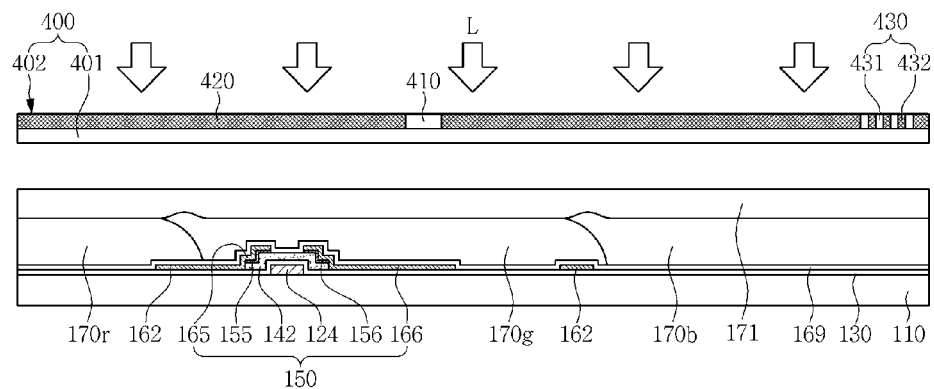

Referring to FIG. 5D, a first exposure mask 400 is disposed on the first photosensitive composition 171 to be spaced apart therefrom. Light L is irradiated onto the first photosensitive composition 171 to thereby expose the first photosensitive composition 171.

The first exposure mask 400 includes a transmissive portion 410, a light shielding portion 420, and a semi-transmissive portion 430. The first exposure mask 400 is a three-tone mask.

The transmissive portion 410 of the first exposure mask 400 corresponds to an area for the contact hole 185 to be formed, and the semi-transmissive portion 430 corresponds to an area for the concave portion 195 to be formed. The light shielding portion 420 corresponds to an area other than those areas for the contact hole 185 and the concave portion 195 to be formed.

The transmissive portion 410 has light transmittance having a level of about 95 percent (%) or more, and the light shielding portion 420 has light transmittance having a level of about 5% or less. The semi-transmissive portion 430 has light transmittance having a level in a range of about 50% to about 60%. The level of light transmittance of the transmissive portion 410, the light shielding portion 420, and the semi-transmissive portion 430 may vary based on the type of the first photosensitive composition 171.

For example, the transmissive portion 410 may have a level of light transmittance in a range of about 90% to about 100%, the light shielding portion 420 may have a level of light transmittance in a range of about 0% to about 1%, and the semi-transmissive portion 430 may have a level of light transmittance in a range of about 30% to about 40%, based on the type of the first photosensitive composition 171. In addition, the semi-transmissive portion 430 may have a level of light transmittance in a range of about 60% to about 70%.

The first exposure mask 400 of FIG. 5D includes a transparent glass substrate 401 and a light shielding pattern 402 which is formed on the transparent glass substrate 401. The light shielding pattern 402 may be formed by selectively coating a light shielding material.

The level of light transmittance of the semi-transmissive portion 430 may be adjusted by adjusting a concentration of a light shielding material.

Further, the semi-transmissive portion 430 may have a structure in which a transmissive area 431 and a light shielding area 432 are alternately disposed. In this case, the level of light transmittance of the semi-transmissive portion 430 may be adjusted by adjusting an interval between the transmissive area 431 and the light shielding area 432.

Figure 5E:
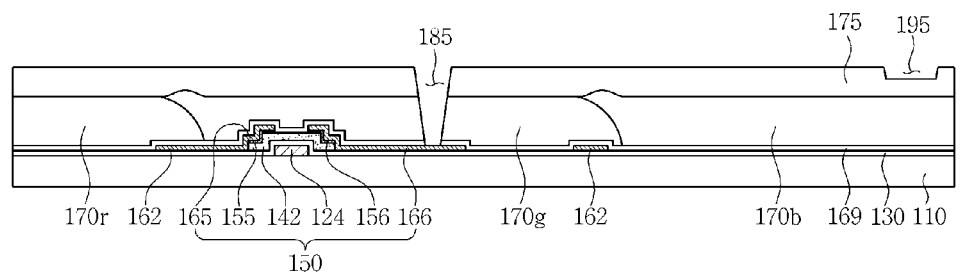

Referring to FIG. 5E, the exposed first photosensitive composition 171 is developed by a developing solution and is cured, and thereby the protection layer 175 is formed.

In detail, respective portions of the insulating interlayer 169, the color filter layer 170, and the first photosensitive composition 171 which are disposed below the transmissive portion 410 of the first exposure mask 400 are removed, and thereby the contact hole 185 through which a portion of the drain electrode 166 is exposed is formed. In addition, a portion of the first photosensitive composition 171 which is disposed below the semi-transmissive portion 430 is partially removed, and thereby the concave portion 195 having the depth $d_1$ is formed.

The protection layer 175 formed as described above with reference to FIG. 5E is an organic layer.

Figure 5F:
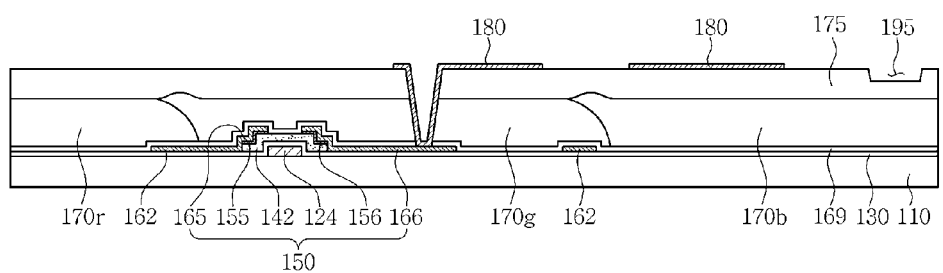

Referring to FIG. 5F, the first electrode 180, which is electrically connected to the drain electrode 166 through the contact hole 185, is formed on the protection layer 175. The first electrode 180 includes a transparent conductive oxide (TCO) such as indium-tin oxide (ITO), indium-zinc oxide (IZO), or aluminum-zinc oxide (AZO).

Figure 5G:
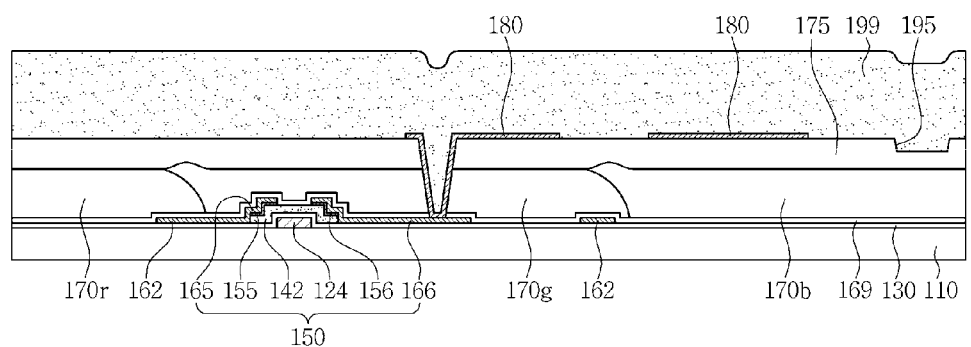

Referring to FIG. 5G, the second photosensitive composition 199 is coated on the protection layer 175 and the first electrode 180. In this instance, the coating of the second photosensitive composition 199 is performed in a state in which a portion of the second photosensitive composition 199 on the contact hole 185 and a portion of the second photosensitive composition 199 on the concave portion 195 are recessed.

The second photosensitive composition 199 includes a negative-type photosensitive composition. In such a negative-type photosensitive composition, a non-exposed portion thereof is developed.

The second photosensitive composition 199 may include a binder resin, a polymerizable monomer, a polymerizable oligomer, a pigment, a dispersant, and/or a photo-initiator. Examples of the pigment may include a black pigment, a black resin, or the like.

Figure 5H:
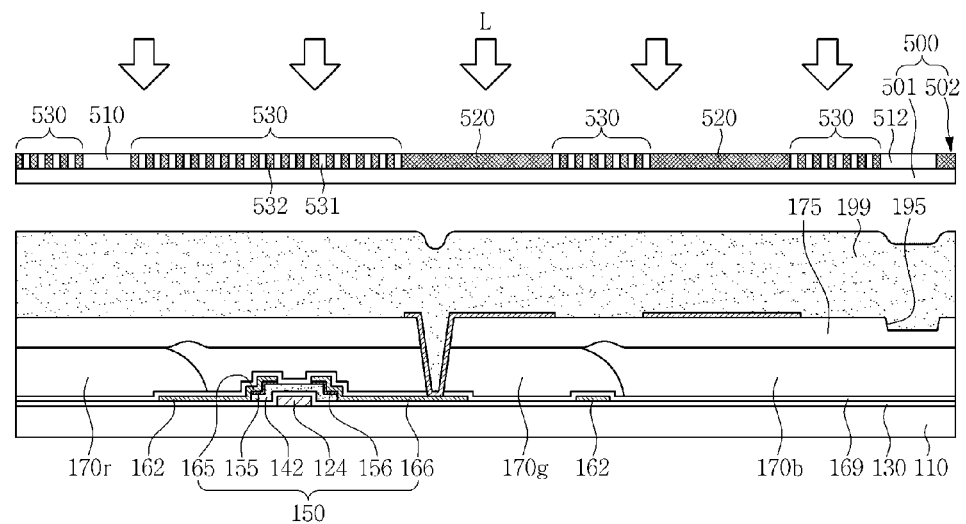

Referring to FIG. 5H, a second exposure mask 500 is disposed on the second photosensitive composition 199 to be spaced apart therefrom. Light L is irradiated on to the second photosensitive composition 199 to thereby expose the second photosensitive composition 199.

The second exposure mask 500 includes a transmissive portion 510, a light shielding portion 520, and a semi-transmissive portion 530. The second exposure mask 500 is a three-tone mask including three areas having different levels of light transmittance from one another.

The transmissive portion 510 of the second exposure mask 500 corresponds to an area for the first column spacer 192 to be formed and an area for the second column spacer 193 to be formed; the light shielding portion 520 corresponds to an area for the first electrode 180 to be formed; and the semi-transmissive portion 530 corresponds to an area for the light shielding layer 191 to be only formed.

The transmissive portion 510 of the second exposure mask 500 has light transmittance having a level of about 95% or more, the light shielding portion 520 has light transmittance having a level of about 5% or less, and the semi-transmissive portion 530 has light transmittance having a level in a range of about 50% to about 60%.

The levels of light transmittance of the transmissive portion 510, the light shielding portion 520, and the semi-transmissive portion 530 may vary based on a thickness $t_1$ of the light shielding layer 191, the type of the second photosensitive composition 199, and the like. For example, the transmissive portion 510 may have light transmittance having a level in a range of about 90% to about 100%; the light shielding portion 520 may have light transmittance having a level in a range of about 0% to about 1%; and the semi-transmissive portion 530 may have light transmittance having a level in a range of about 30% to about 40%. In addition, the semi-transmissive portion 530 may have light transmittance having a level in a range of about 60% to about 70%.

The second exposure mask 500 includes a transparent glass substrate 501 and a light shielding pattern 502 which is formed on the transparent glass substrate 501. The light shielding pattern 502 may be formed by selectively coating a light shielding material.

The level of light transmittance of the semi-transmissive portion 530 may be adjusted by, for example, adjusting a concentration of a light shielding material.

Further, the semi-transmissive portion 530 may have a structure in which a transmissive area 531 and a light shielding area 532 are alternately disposed. In this case, the level of light transmittance of the semi-transmissive portion 530 may be adjusted by adjusting an interval between the transmissive area 531 and the light shielding area 532.

Figure 5I:
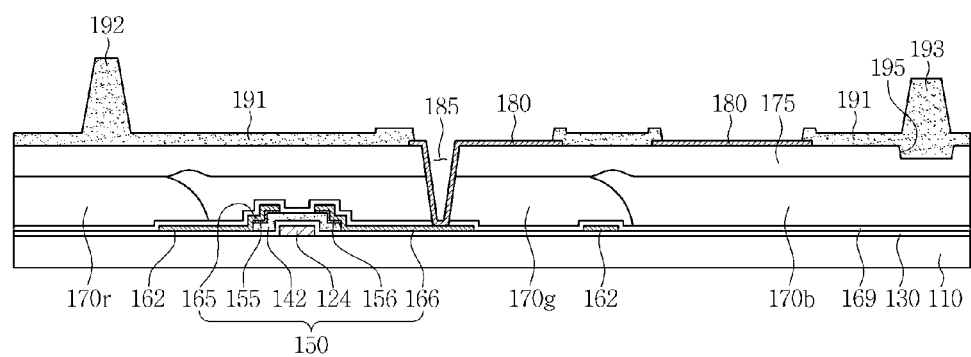

Referring to FIG. 5I, the exposed second photosensitive composition 199 is developed by a developing solution and is cured, and thereby the light shielding unit 190 including the light shielding layer 191, the first column spacer 192, and the second column spacer 193 is formed.

The second substrate 210 is disposed on the light shielding unit 190 to oppose the first substrate 110, and the liquid crystal layer 300 is interposed between the first substrate 110 and the second substrate 210.

More particularly, the second electrode 220 is disposed on the second substrate 210 to thereby form the upper panel 200, the liquid crystal layer 300 is interposed between the lower panel 100 and the upper panel 200 while having the first and second column spacers 192 and 193 therebetween, and the lower panel 100 and the upper panel 200 are bonded to one another, such that the LCD device 10 illustrated in FIG. 2 is obtained.

According to the first exemplary embodiment, since the concave portion 195 is formed in the protection layer 175, four areas having different distribution ratios of the second photosensitive composition 199 therein may be formed by the second exposure mask 500, which is a three-tone mask.

In detail, the lower panel 100 may be divided into four areas based on the distribution ratio of the second photosensitive composition 199. In other words, the lower panel 100 may be divided into a first area in which the entirety of the second photosensitive composition 199 is removed, for example, a portion of the lower panel 100 corresponding to an area in which the first electrode 180 is formed, a second area in which a portion of the second photosensitive composition 199 is removed so as to form the light shielding layer 191, for example, portions of the lower panel 100 corresponding to areas in which the gate line 122 and the data line 162 are formed, respectively, a third area in which the second column spacer 193 is positioned, and a fourth area in which the first column spacer 192 is positioned.

In a case in which the concave portion 195 is absent in the protection layer 175, a four-tone mask may be used to form such four areas. Since the four-tone mask includes four areas having different levels of light transmittance from one another, the levels of light transmittance among the respective areas may not considerably differ from another. Accordingly, in the case of using the four-tone mask, a difference between degrees of exposure within the respective areas may not be clearly exhibited during the exposure process, and thus, the respective areas may not be clearly distinguished from one another when being developed. In other words, a light shielding pattern may be damaged or an error in the formation of the light shielding pattern may occur.

On the other hand, the three-tone mask may include three areas having different levels of light transmittance from one another, and the respective areas may be provided to have considerably different levels of light transmittance from one another. Accordingly, in the case of using the three-tone mask, a difference between degrees of exposure within the respective areas may be clearly exhibited during the exposure process, and thus, an error in the formation of a light shielding pattern may be reduced.

As set forth above, according to one or more exemplary embodiments, the display device may include the light shielding unit that may be formed using the exposure mask having three or less tones. Accordingly, the error in the formation of the light shielding pattern that may occur during the process of manufacturing of the display device may be reduced.

From the foregoing, it will be appreciated that various embodiments in accordance with the present disclosure have been described herein for purposes of illustration, and that various modifications may be made without departing from the scope and spirit of the present teachings. Accordingly, the various embodiments disclosed herein are not intended to be limiting of the true scope and spirit of the present teachings. Various features of the above described and other embodiments can be mixed and matched in any manner, to produce further embodiments consistent with the inventive concept.

What is claimed is:
1. A display device comprising:
a first substrate;

a wiring unit disposed on the first substrate and comprising a thin film transistor;
a protection layer disposed on the wiring unit and comprising at least a concave portion; and
a light shielding unit disposed on the protection layer,
wherein the light shielding unit comprises:
a light shielding layer;
a first column spacer protruding from the light shielding layer; and
a second column spacer disposed on the concave portion and protruding from the light shielding layer to be spaced apart from the first column space,
wherein the light shielding layer, the first column spacer, and the second column spacer are formed of a same material and are formed in one-piece, and
wherein the first column spacer has a height greater than a height of the second column spacer based on an upper surface of the light shielding layer.

2. The display device of claim 1, wherein the first column spacer has a substantially same thickness as a thickness of the second column spacer based on a bottom surface of the light shielding layer.

3. The display device of claim 1, wherein the protection layer comprises a photosensitive organic material.

4. The display device of claim 1, further comprising a color filter layer interposed between the first substrate and the protection layer.

5. The display device of claim 1, further comprising a first electrode disposed on the protection layer.

6. The display device of claim 1, further comprising a second substrate disposed on the light shielding unit to oppose the first substrate.

7. The display device of claim 6, wherein the first column spacer supports the second substrate.

8. The display device of claim 6, further comprising a liquid crystal layer interposed between the first substrate and the second substrate.

9. A method of manufacturing a display device, the method comprising:
forming a wiring unit comprising a thin film transistor, on a first substrate;
forming a protection layer comprising a concave portion on the wiring unit; and
forming a light shielding unit comprising a light shielding layer, a first column spacer and a second column spacer, on the protection layer,
wherein the second column spacer is formed on the concave portion of the protection layer, and
wherein the first column spacer has a height greater than a height of the second column spacer based on an upper surface of the light shielding layer.

10. The method of claim 9, wherein the first column spacer has a substantially same thickness as a thickness of the second column spacer based on a bottom surface of the light shielding layer.

11. The method of claim 9, wherein the forming of the protection layer comprises:
coating a first photosensitive composition for forming a protection layer, on the wiring unit;
exposing the first photosensitve composition by disposing a first exposure mask on the first photosensitve composition and irradiating light on to the first photosensitive composition; and
developing the exposed first photosensitive composition and curing,
wherein the first exposure mask comprises a transmissive portion, a semi-transmissive portion, and a light shielding portion.

12. The method of claim 11, wherein the semi-transmissive portion of the first exposure mask corresponds to an area for the concave portion to be formed.

13. The method of claim 9, wherein the forming of the light shielding unit comprises:
coating a second photosensitive composition for forming a light shielding unit, on the protection layer;
exposing the second photosensitve composition by disposing a second exposure mask on the second photosensitve composition and irradiating light on to the second photosensitive composition; and
developing the exposed second photosensitive composition and curing,
wherein the second exposure mask comprises a transmissive portion, a semi-transmissive portion, and a light shielding portion.

14. The method of claim 13, wherein the transmissive portion of the second exposure mask corresponds to an area for the first column spacer to be formed and an area for the second column spacer to be formed.

15. The method of claim 9, further comprising forming a color filter layer on the first substrate, prior to the forming of the protection layer.

16. The method of claim 9, further comprising forming a first electrode on the protection layer, subsequent to the forming of the protection layer and prior to the forming of the light shielding unit.

17. The method of claim 9, further comprising disposing a second substrate on the light shielding unit to oppose the first substrate, subsequent to the forming of the light shielding unit.

* * * * *